United States Patent [19]

Horsitmann

[11] 4,101,826
[45] Jul. 18, 1978

[54] FAULT INDICATOR INCLUDING A REED RELAY RESPONSIVE TO ABOVE NORMAL CURRENT FLOW IN A CONDUCTOR

[76] Inventor: Hendrik Horsitmann, Nesenhaus 22, 403 Ratingen, Fed. Rep. of Germany

[21] Appl. No.: 805,694

[22] Filed: Jun. 13, 1977

[51] Int. Cl.² .................... G01R 31/02; G01R 19/16
[52] U.S. Cl. ............................... 324/51; 324/133; 340/664
[58] Field of Search ............... 324/51, 52, 67, 102, 324/127, 133, 126; 340/248 C, 248 D, 253 A, 253 Q, 331, 340, 258 C, 258 D

[56] References Cited

U.S. PATENT DOCUMENTS

| 2,651,021 | 9/1953 | Hays | 340/253 Q X |
| 3,524,133 | 8/1970 | Arndt | 324/126 X |
| 3,771,049 | 11/1973 | Piccione | 324/133 X |
| 3,944,921 | 3/1976 | Tsuda et al. | 324/133 |
| 4,034,360 | 7/1977 | Schweitzer | 324/133 |

FOREIGN PATENT DOCUMENTS

| 2,317,682 | 10/1974 | Fed. Rep. of Germany | 324/133 |

Primary Examiner—Gerard R. Strecker
Attorney, Agent, or Firm—Ralf H. Siegemund

[57] ABSTRACT

A fault indicator includes a reed relay disposed for responding to a magnetic field surrounding a conductor particularly when conducting above-normal current. The relay triggers a latch which enables a counter and starts a pulse generator which, in turn, drives a flasher, and the pulses are counted for resetting the device by resetting the latch after a number of pulses have been counted. The reed relay is disposed in a position for adjustment of alignment and misalignment in relation to the conductor.

10 Claims, 3 Drawing Figures

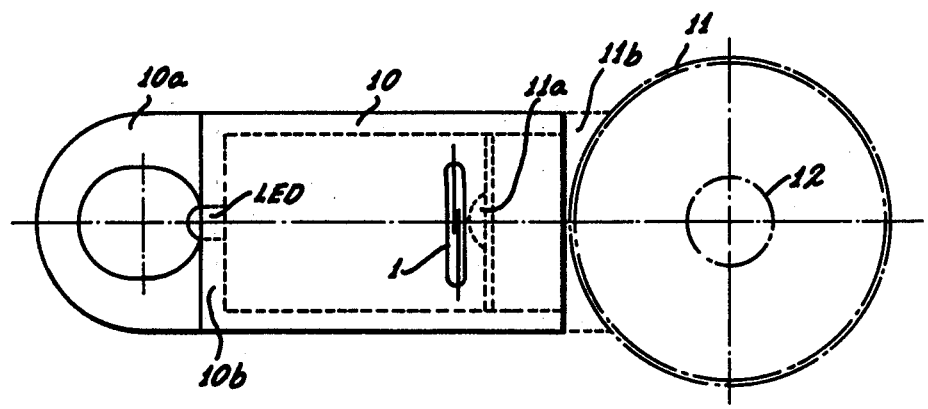
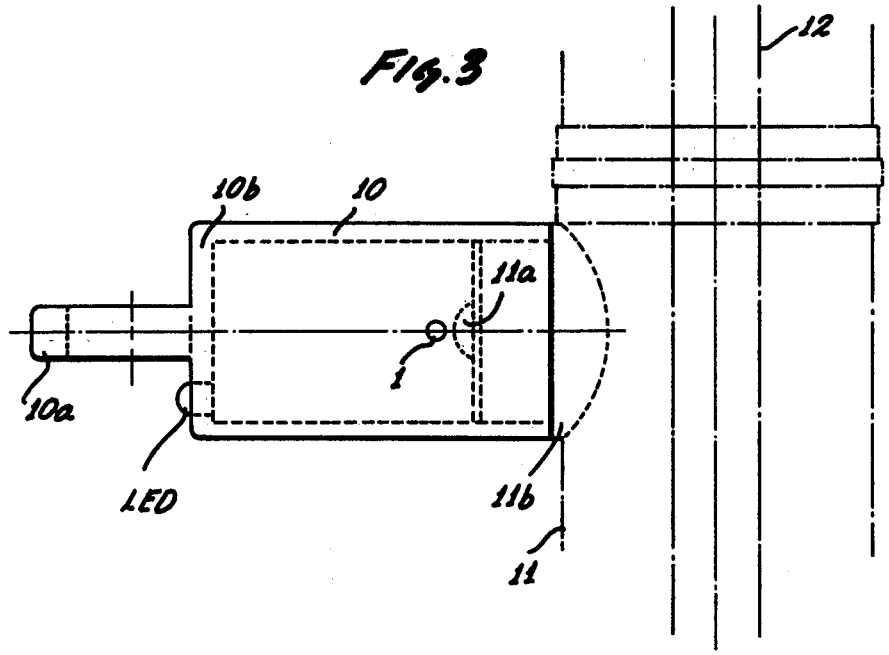

FAULT INDICATOR INCLUDING A REED RELAY RESPONSIVE TO ABOVE NORMAL CURRENT FLOW IN A CONDUCTOR

BACKGROUND OF THE INVENTION

The present invention relates to fault indicators of the type which respond to an abnormally high electric current, in a conductor, cable, busbar, power line, etc.

Fault indicators of the type to which the invention pertains are known in at least one configuration based on the principle of inductive current sensing in a conductor. For example, U.S. Pat. No. 3,895,296, discloses a fault indicator which is in some fashion suspended on a cable and includes a current transformer whose sensing winding controls an indicator. The current in that sensing winding is also used to reset the indicator. A current transformer to be used in conjunction with such a fault indicator is shown, for example, in U.S. Pat. No. 3,962,661. Installation of such a transformer, particularly looping it around the cable, is rather difficult. Also, the surfaces exposed upon separation of the core parts are prone to accumulate dirt which may change the response for triggering as well as for resetting.

DESCRIPTION OF THE INVENTION

It is an object of the present invention to provide a new and improved fault indicator which is of simple construction and can be installed easily.

In accordance with the present invention, it is suggested to provide a reed contact for exposure to the magnetic field surrounding the conductor, cable, busbar, etc. to be supervised. The reed contact, when responding, triggers an electronic latch which enables a counter and a pulse generator, the counter counts the pulses from the generator until a particular count number has been reached, whereupon the latch is reset. The pulses of the generator drive a blinking or flushing device. The equipment is self-powered through a long life battery.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2 is a side view of the case containing the circuit of FIG. 1; and

FIG. 3 illustrates the case of FIG. 2 from the top.

Proceeding now to the detailed description of the drawings, FIG. 1 shows a reed contact relay 1 which is to be disposed in the magnetic field of a conductor 12. The reed relay has a disposition so that the normal or regular current does not produce a sufficiently strong magnetic field for causing the relay to respond. However, in the case of a fault, the reed relay will respond to the large magnetic field of a short circuit current surge in conductor 12.

Figure 1:
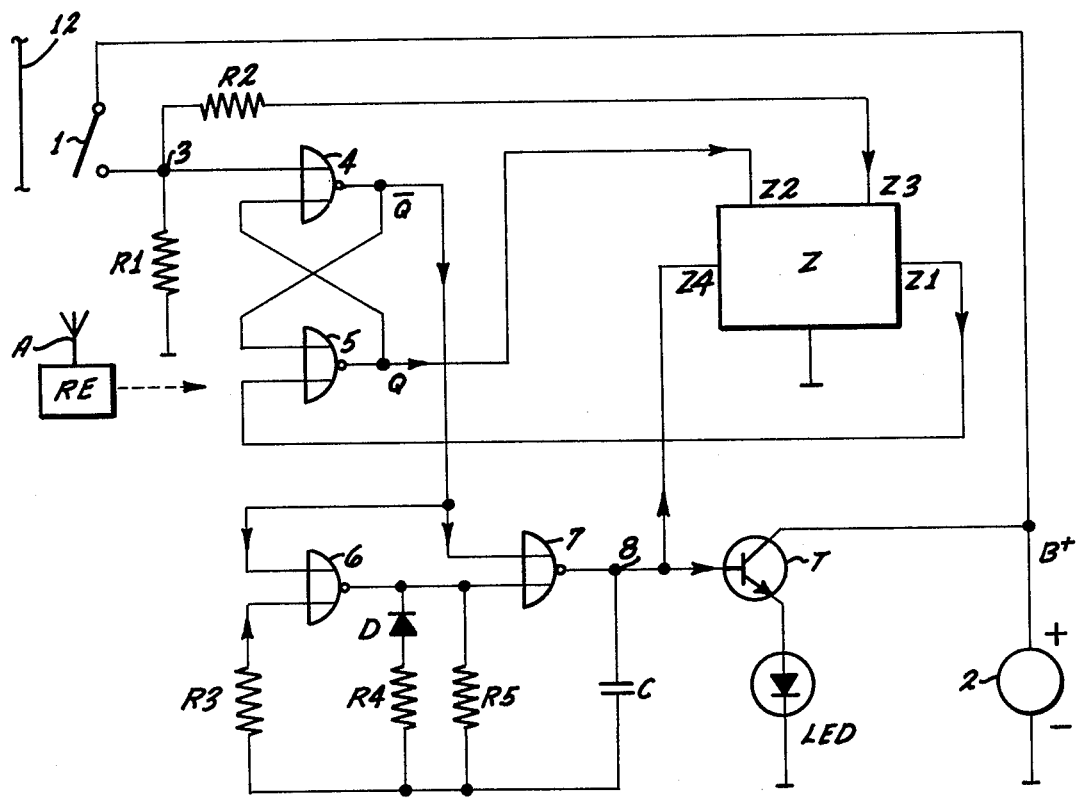
FIG. 1 is a circuit diagram of an example for the preferred embodiment in accordance with the invention.

One of the reed contacts 1 is connected to B+ of a battery 2. The battery 2 is preferably a lithium battery having a very long life. As will be described, the standby power drain of the fault indicator is so low that the device is a stand alone unit which requires a replacement of the battery only very infrequently. The other one of the reed contacts is connected to a junction 3 of two resistors R1 and R2. In the preferred embodiment, resistors R1 and R2 have, respectively, 560 ohms and 5.6 kilohms. In addition, junction 3 is connected to one input of a flip-flop or latch which is composed of two cross-coupled positive NOR gates 4 and 5 (or negative NAND gates). The other input of the latch is connected to the output Z1 of a counter Z. That output is low as long as the counter Z has not reached a particular count state and as long as power is not applied to the counter in the first place.

One output of the flip-flop (output of gate 5, Q) is connected to an input Z2 of counter Z. This input is, in effect, the voltage supply input for the counter, and the flip-flop (in conjunction with the battery 2) acts as controlled power supply device for the counter Z. A reset input Z3 of the counter is connected to resistor R2. Accordingly, the counter is reset whenever a voltage is applied to counter Z via the resistor R2. Resistor R1 is grounded, so is the negative pole of battery 2.

The other output of the flip-flop, $\bar{Q}$-gate 4, is connected to control a clock generator having two cross-coupled NOR gates 6 and 7, three resistors R3, R4, and R5, a capacitor C and a diode D. These elements are interconnected to establish an astable multivibrator producing high output pulses at the output of gate 7 of short duration followed by larger pauses. In the preferred embodiment, resistors R3, R4, and R5, have, respectively, resistances (in megohms) of 1; 0.082; and 3.5. The capacitor has a capacitance of 0.33 $\mu F$. The two inputs of this multivibrator are tied together and connect to the gate 4 output of the flip-flop. If that $\bar{Q}$ output of the flip-flop is high, the multivibrator is deactivated, its output, terminal 8, is and remains necessarily low.

The output of that generator, junction 8, is connected to the counting pulse input Z4 of counter Z and, additionally, to the base electrode of a transistor T. This transistor T is the driver stage for a light emitting diode LED, which is connected between the emitter of the transistor and ground. The collector of the transistor is connected to B+ of Z. The transistor T and the diode LED together constitute a signalling device, emitting light flashes whenever transistor T is rendered conductive. Transistor T is conductive when the signal level in terminal 8 is high. The LED is and remains off when the flip-flop provides a high $\bar{Q}$ output.

The circuit operates as follows. The reed contact 1 is normally open. Therefore, ground is applied to the gate 4, input of the flip-flop, so that the $\bar{Q}$ output of that gate is necessarily high. The high signal level is established through leakage path coupling to B+ via elements 7 and T. Through cross-coupling, the Q output of gate 5 is low so that the counter is deactivated. The $\bar{Q}$ output holds the pulse generator in the disabled state, i.e. the multivibrator cannot vibrate, and the output signal at terminal 8 is low; transistor T is now conductive, and LED is off. Thus, there is no power drain to speak of on the battery 2.

As stated, reed contact 1 is disposed in a plane that extends parallel to conductor 12 to be monitored as to any high current attributable to a fault condition. The disposition of the reed relay is chosen so that a particular current in conductor 12 will trip the fault indicator. If such tripping current occurs in conductor 12, the contact 1 is closed, at least temporarily. B+ is now applied to the gate 4 input terminal 3 of the flip-flop and the output Q of gate 5 goes high and holds regardless of any further development of operating voltage at junction 3. In other words, the output of 5 remains high even if the reed flutters and reopens.

The flip-flop voltage from gate 5 is applied to terminal Z2 as operating voltage for the counter. In addition, B+ is applied via resistor R2 to the reset input Z3 of the counter for resetting the counter. Conceivably, the counter may be held to the reset state for the duration of the B+ voltage on terminal 3.

The low output from gate 4 applies, in effect, ground to the two gates 6 and 7, and this pulse generator starts to oscillate at a 1 Hz frequency. In other words, brief pulses of short duration are produced at a 1 Hz pulse rate. Accordingly, transistor T receives control signals at that rate and operates LED accordingly, so that the signal generator T-LED produces light flashes.

The pulses in terminal 8 are also applied to the input Z4 of counter Z. However, the pulses are not counted as long as the B+ voltage is applied to the reset terminal. However, the counter could be constructed so that resetting occurs only on the upswing signal edge in terminal Z3. Thus, counting may commence following the beginning or the removal of the fault condition as desired. After $2^n$ counted pulses, a high output appears at the output Z1 of the counter Z, resetting the latch 4,5, and turning the pulse generator off; counting and blinking ceases. It will be appreciated that the signalling device T-LED could be replaced by a pulse transformer, a storage capacitor and a flash tube.

The circuit, including the long life battery 2 and the diode LED, are preferably mounted in a small plastic case, as is shown in FIGS. 2 and 3. The case 10 is basically a hollow plastic cylinder, having a handle 10a on its one front end 10b. This wall 10b has a small aperture which receives the LED. Alternatively, the casing could be made of or lined with metal to establish a Faraday cage for protection against lightning. Also, the flashing and blinking device could be a flashing tube covered with a light scattering hood.

In either case, the circuit is contained in the case 10, either in wired configuration or on a printed circuit board. After insertion of the circuit, the interior of the case may be potted, i.e., cast in synthetic resin, synethtic rubber, or the like. It is, however, essential that the encapsuled reed relay 1 assumes a particular orientation. i.e., parallel to the other, the right-hand end wall of the cylindrical case. The interior of the case 10 may not be completely filled with filler plastic, but the (in the drawing right-hand) case portion, opposite case wall 10b establishes a tubular recess.

The dash-dot lines in FIGS 2 and 3 denote a high voltage test plug 11 having a cylindrical portion 11b which extends at right angles from the conductor 12. This portion 11b carries the voltage test and sense point 11a of that plug. Upon inserting portion 11b into the above-mentioned recess of case 10, test point 11a has a definite distance from the reed 1.

This particular disposition establishes a definite distance between conductor 12 and reed 1. The magnetic field lines run in concentric circles around conductor 12 and pass through the reed contact in longitudinal direction.

The high voltage test fitting or plug employed may not have a definite test point. In this case, case 10 is provided with a concave front end (opposite handle 10a) to be placed directly onto the cylindrical body 11 but extending again at right angles therefrom. The case 10 will then be fastened to the plug in any suitable manner, e.g., by clamping strap.

It is apparent that for given geometric configurations and circuit parameters, the fault location has maximum response sensitivity (i.e. will respond and trip to a particular, relatively low current in conductor 12, the current being, of course, well in excess of normal current under conditions deemed faultless) if the reed contact is located in and in alignment with the magnetic field lines. Turning the case 10 with its reed contact about the axis of the case, it reduces the sensitivity. That is to say, the trip current for response of the fault indicator is increased. Thus, by simply turning the case, one desensitizes the fault indicator by increasing the setting for the trip current. For example, the maximum sensitivity may be at 200A, which trip condition is established on full alignment of the reed relay with the magnetic field. Turning the case may increase the trip setting to 300A or 400A etc. Furthermore, this simple mode of adjustment permits the establishing of a staggered set of responses in a conductor system. One instrument will respond to, say, 200A, another one to 300A, another one will trip at a 400A setting etc.

The timer circuit can be adjusted to different periods of duration. Thus, upon programming the counter Z, the LED may blink for a few minutes, an hour, or 2, or 5 hours. Even after normal conditions have been restored, the LED may still blink to indicate that there was a particular short circuit or excess current condition. In the alternative, one may wish to stop the indication immediately following restauration of normal conditions or after personnel has become cogniscant of and remedied the situation. Accordingly, the device may be supplemented by connecting a ferrite antenna A to the gate 5 input of the flip-flop, via an r-f receiver-amplifier RE to reset the flip-flop, so that the blinking stops.

This resetting may be automated by placing the antenna A in the vicinity of the conductor 12 to be responsive to the surge that occurs when normal conditions are restored. The receiver RE may be powered off as long as the reed 1 is closed, so that the fault current does not influence the receiver. The receiver will be powered on again after the fault current has been turned off, opening relay 1, and the receiver now waits for restauration of a normal current flow which will not trip the fault indicator, but will turn the signalling device off.

As stated, the transistor-LED combination can be replaced by other known flashing equipment of the type known for electronic flashes. This may be advisable if the device is observed over a large distance.

The apparatus may be used in subterranian stations or other circuits which are not easily accessible or visible. On the other hand, the reed contact must have a well-defined position in relation to the conductor 12. Accordingly, the parts may be housed in different cases. One case may just hold the reed contact (or at least the reed contact but not the flasher), and that case is positioned in relation to the conductor to be supervised as described. The LED on the other hand, is contained in a second casing which is mounted to be clearly visible. The remaining circuitry may be contained in one or the other case or is appropriately distributed but with a minimum of connectors between them. Preferably, one should provide for just a three-line connection, B+, ground, and one signal line.

As stated, the battery is preferably of the lithium variety which may operate on LED for a total of 500 blinking hours. The current drain resulting from operating the other circuit elements, is comparatively negligible. The battery can easily be exchanged, if the casting-filler for the case is soft. The equipment, when completed, can be tested by means of a permanent magnet.

The invention is not limited to the embodiments described above but all changes and modifications thereof not constituting departures from the spirit and scope of the invention are intended to be included.

I claim:

1. Fault circuit indicator, comprising:

a reed contact relay to be placed into the magnetic field surrounding a conductor to be supervised as to any excess electrical current;

an electronic latch connected to be operated by the reed contact to assume a first state upon closing of the reed contact;

a pulse generator connected to be operated by the latch when the latch is in the first state, the latch inhibiting the generator when the latch is in a second state;

a visible signalling device connected to the pulse generator to emit blinking signals in response to pulses when generated by the generator;

an electronic counter also connected to the generator to count blinking pulses, and further connected to the latch to reset the latch to the second state after counting a particular number of pulses; and a long life battery connected to operate the latch, the generator, the counter and the signalling device.

2. Indicator as in claim 1, said signalling device including a transistor connected to the generator, further including a light emitting diode controlled by the transistor.

3. Indicator as in claim 1, and including a case containing the latch, the generator, the counter, the signalling device, and the battery, and having an opening at its front end through which said blinking pulses are visible.

4. Indicator as in claim 1, and in combination with mounting means connected to the conductor, to establish a definite distance between the conductor and the reed relay.

5. Indicator as in claim 1, including means for mounting the reed relay in particular distance relation to the conductor.

6. Indicator as in claim 5, the means for mounting establishing alignment of the reed relay with a magnetic field surrounding the conductor.

7. Indicator as in claim 6, the means for mounting adapted for changing the alignment to desensitize the indicator.

8. Indicator as in claim 1, said battery being a lithium battery.

9. Indicator as in claim 1, and including additional means for resetting the latch.

10. Indicator as in claim 9, said additional means being responsive emission of electromagnetic waves, accompanying resumption of normal current flow in the conductor.

* * * * *

UNITED STATES PATENT AND TRADEMARK OFFICE
CERTIFICATE OF CORRECTION

PATENT NO. : 4,101,826
DATED : July 18, 1978
INVENTOR(S) : Hendrik Horstmann

It is certified that error appears in the above-identified patent and that said Letters Patent are hereby corrected as shown below:

[19] HORSTMANN

[76] Hendrik Horstmann, Nesenhaus 22,
403 Ratingen, Fed.Rep.of Germany

Signed and Sealed this

Sixth Day of March 1979

[SEAL]

Attest:

RUTH C. MASON
*Attesting Officer*

DONALD W. BANNER
*Commissioner of Patents and Trademarks*